United States Patent
Navoni et al.

(10) Patent No.: US 6,748,390 B2
(45) Date of Patent: Jun. 8, 2004

(54) ASSOCIATIVE MEMORY DEVICE WITH OPTIMIZED OCCUPATION, PARTICULARLY FOR THE RECOGNITION OF WORDS

(75) Inventors: Loris Navoni, Cernusco Sul Naviglio (IT); Roberto Canegallo, Tortona (IT); Mauro Chinosi, Cologno Monzese (IT); Giovanni Gozzini, Palazzolo Sull'Oglio (IT); Alan Kramer, Agrate Brianza (IT); Pierluigi Rolandi, Volpedo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/137,109

(22) Filed: Apr. 30, 2002

(65) Prior Publication Data

US 2003/0014240 A1 Jan. 16, 2003

Related U.S. Application Data

(62) Division of application No. 09/023,151, filed on Feb. 12, 1998, now Pat. No. 6,415,293.

(30) Foreign Application Priority Data

Feb. 12, 1997 (EP) .............................................. 97830054

(51) Int. Cl.[7] .............................................. G06F 17/30
(52) U.S. Cl. ........................ 707/100; 711/103; 711/128; 711/172; 711/173
(58) Field of Search ...................... 707/100, 2; 711/128, 711/173, 170, 103, 172; 704/10

(56) References Cited

U.S. PATENT DOCUMENTS

| | | | |
|---|---|---|---|
| 3,911,227 A | 10/1975 | Lawrence et al. ...... | 179/18 ES |
| 4,538,243 A | 8/1985 | Zehner ......................... | 365/49 |
| 4,771,385 A | * 9/1988 | Egami et al. ............... | 715/532 |
| 4,942,556 A | * 7/1990 | Sasaki et al. ............... | 365/200 |
| 4,958,377 A | 9/1990 | Takahashi .................... | 382/34 |
| 4,991,135 A | 2/1991 | Yoshimura et al. ......... | 364/900 |
| 5,319,589 A | 6/1994 | Yamagata et al. ........... | 365/49 |
| 5,446,844 A | 8/1995 | Steckler et al. ............. | 395/250 |
| 5,455,784 A | 10/1995 | Yamada ....................... | 365/49 |
| 5,602,770 A | 2/1997 | Ohira ........................... | 365/49 |
| 5,777,608 A | 7/1998 | Lipovski et al. ............. | 345/189 |
| 5,860,136 A | * 1/1999 | Fenner ........................ | 711/201 |

FOREIGN PATENT DOCUMENTS

| | | |
|---|---|---|
| DE | 3311 665 A1 | 10/1984 |
| DE | 3801 380 A1 | 7/1988 |
| EP | 0 554 177 A1 | 8/1993 |

* cited by examiner

*Primary Examiner*—Jean R. Homere
(74) *Attorney, Agent, or Firm*—Lisa K. Jorgenson; Robert Iannucci; Seed IP Law Group PLLC

(57) ABSTRACT

A memory device having an associative memory for the storage of data belonging to a plurality of classes. The associative memory has a plurality of memory locations aligned along rows and columns for the storage of data along the rows. Each memory row has a plurality of groups of memory locations, each storing a respective datum, wherein groups of memory locations adjacent along one and the same row store data belonging to different classes. Groups of memory locations adjacent in the direction of the columns and disposed on different rows store data belonging to one and the same class. Each class has data having a different maximum lengths. The device is particularly suitable for the storage of words belonging to a dictionary for automatic recognition of words in a written text.

17 Claims, 4 Drawing Sheets

|  | 0...max(1)−1 | max(1)...max(1)+max(2)−1 | ... | $\sum_{i=1}^{i-1} max(1)...N$ |
|---|---|---|---|---|
|  | elem.0 cl.1 | elem.0 cl.2 | ... | elem.0 cl.i |
|  | elem.1 cl.1 | elem.1 cl.2 | ... | elem.1 cl.i |
|  | elem.2 cl.1 | elem.2 cl.2 | ... | elem.2 cl.i |
|  | ... | ... | ... | ... |

FIG. 3

| Column | 0...3 | 4...8 | 9...14 | 15...21 | 22...29 | 30...39 | 39...63 |
|---|---|---|---|---|---|---|---|
| Max no. of chars. | 4 | 5 | 6 | 7 | 8 | 9 | 24 |
| No. of words | 3177 | 3169 | 3877 | 4072 | 3622 | 3093 | 4080 |

FIG. 4

ASSOCIATIVE MEMORY DEVICE WITH OPTIMIZED OCCUPATION, PARTICULARLY FOR THE RECOGNITION OF WORDS

CROSS-REFERENCE TO RELATED APPLICATION

This application is a divisional of pending U.S. patent application Ser. No. 09/023,151, filed Feb. 12, 1998.

TECHNICAL FIELD

The invention relates to an associative memory device with optimized occupation, particularly for the recognition of words.

BACKGROUND OF THE INVENTION

As is known, for reading text, particularly handwritten text, various character recognition systems have been developed, based on text segmentation to separate the individual characters or portions thereof one from another, and on processing of the segments obtained to identify the characters. This procedure outputs a series of characters including spaces and punctuation marks.

Current systems are not, however, always capable of outputting correct data because of the presence of noise, the particular graphical characteristics of the text or the limited capacities of the recognition system. Consequently, further processing of the characters is necessary so as to guarantee the correctness of the sequence of characters and the extraction of meaningful words.

For these reasons, word recognition devices have been proposed which compare an input word to be recognized with a plurality of words belonging to a vocabulary, until a word in the vocabulary is identical to or nearest to that to be recognized is identified. The comparison procedure, carried out sequentially on the words in the vocabulary, does, however, require a considerable amount of time.

To solve this problem, in a patent application filed by the applicant on the same date, use is proposed of an associative memory, in which the word to be recognized is compared in parallel with all the stored words, enabling search times to be considerably reduced and hence permitting effective use in a word recognition device.

In currently used associative memories, data are stored by lines, or each line (each row for example) is intended for the storage of a single datum. For word recognition, however, given that the words belonging to a vocabulary have different length, the problem of optimizing memory contents so as to be able to store a sufficient number of words in a memory of modest size exists. Furthermore, the words must be easily searchable for comparison to the input word.

SUMMARY OF THE INVENTION

An object of the invention is to provide an associative memory, the organization of which is such as to improve optimization of memory occupation, improving extractability of stored data therefrom.

In general terms, the problem may be formulated as follows: given an associative memory of size M×N, containing M vectors of size N, given a database of Z vectors (where Z>M) of dimensions which are not constant but all less than N, the problem is that of organizing the associative memory in such a way as to store this database in the associative memory, optimizing its use.

In a first embodiment, the present invention includes a method having steps of parsing input data to provide a portion delimited by predetermined characteristics and determining a length of the portion. The method also includes steps of comparing the length to a table of lengths of data stored in an associative memory and providing the portion to a section of the associative memory containing data having lengths comparable to the portion. The method further includes steps of identifying a closest match between a datum stored in the section and the portion and storing an address from the associative memory corresponding to the datum in a second memory.

In a second embodiment, the invention includes a method having steps of parsing a dataset comprising sequences of analog values to determine lengths associated with each datum of the dataset, collecting data from the dataset having comparable lengths into groups and writing each group of the groups of data to a separate section of an associative analog memory.

BRIEF DESCRIPTION OF THE DRAWINGS

For an understanding of the invention a preferred embodiment will now be described, purely by way of non-exhaustive example, with reference to the accompanying drawings in which:

FIGS. 3 and 4 show tables relating to the organization of the memory of FIG. 2.

DETAILED DESCRIPTION OF THE INVENTION

Figure 1:
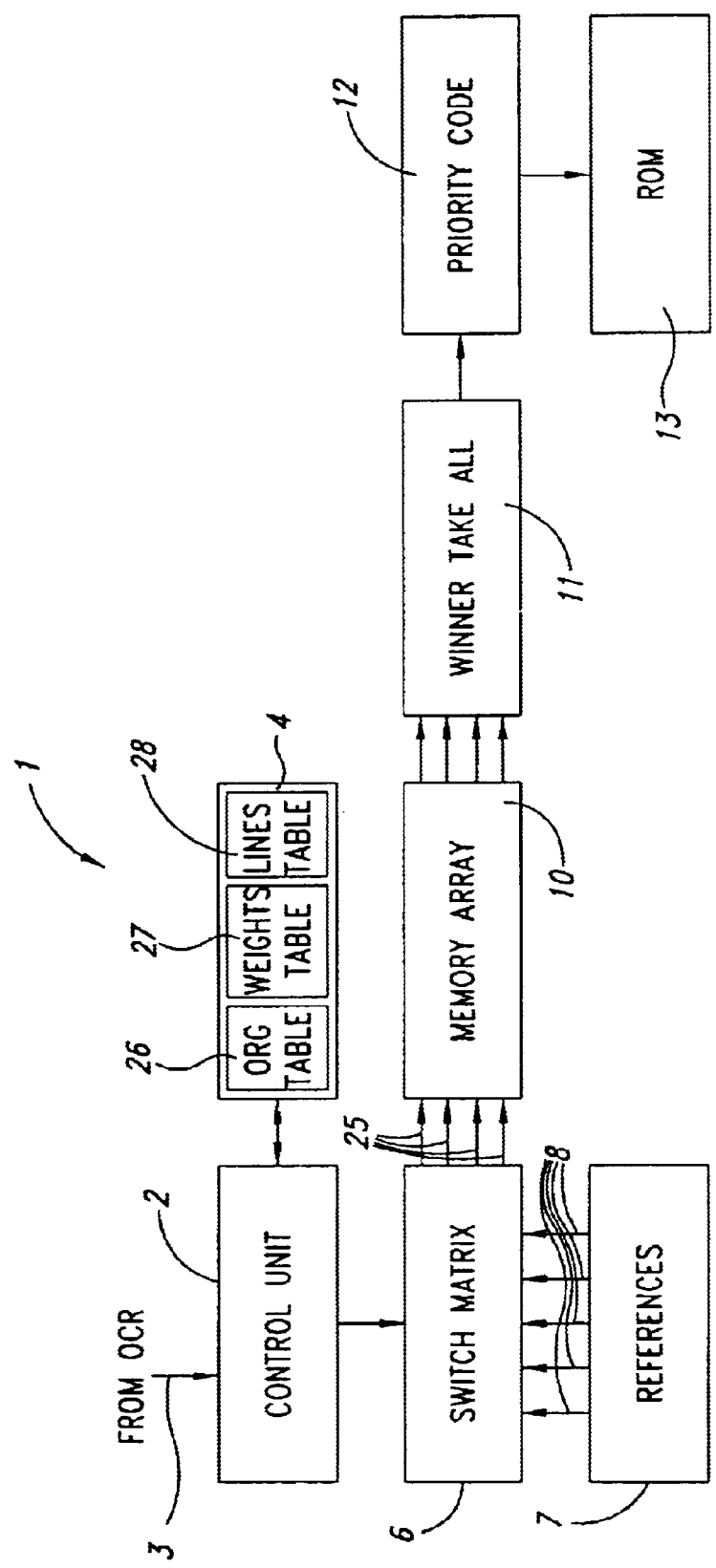
FIG. 1 is a general block diagram of a word recognition device using the associative memory according to the invention.

In FIG. 1, the associative memory, denoted by 10, forms part of a word recognition device 1. The device 1 is located downstream of an OCR or optical character recognition system (not shown) of known type.

The device 1 comprises a control unit 2, which coordinates the activities of the device, as described in this specification below, and has an input 3 at which it receives, from the OCR system, strings of characters on the basis of which the words are to be recognized; a data memory 4, storing data necessary for the control unit 2 and coupled thereto; a switch matrix 6, coupled to the control unit 2 and, through input lines 25, to the memory 10; a reference voltage generator 7, coupled to the switch matrix 6 via lines 8; a selection block 11; a priority code generation block 12, coupled to the output of the selection block; and a memory element 13, coupled to the output of the priority code generation block 12.

In detail, the control unit 2, which may be a microprocessor or other software processing unit, for example, determines the length of successive words, supplied by the character recognition system, on the basis of the length of the strings of characters not separated by spaces or punctuation marks. On the basis of the architecture of the memory and of the coding used for the characters, it also commands the switch matrix 6. For this purpose the data memory 4 stores data relating to the organization of the memory 10 (in the example, it stores a table 26 which supplies the correspondence between the length of the stored words and the columns of the memory 10 in which those words are stored, as described below); data relating to the coding used for the individual characters (or it stores a table 27 which supplies the correspondence between each character of the alphabet and the associated relative weight, e.g., voltage level); and data relating to the generation of the weights (for example, it stores a table 28 which supplies the correspondence between each weight and the line 8 on which the relative voltage level is available). The voltage values corresponding to the weights of the different letters, according to this coding, are generated by the reference voltage generator 7 which may, for example, be provided as described in European patent application 96830498.0 filed on Sep. 30, 1996 in the name of this applicant. The switch matrix 6 may be of any acceptable type of the many known in the prior art, such as that described in European patent application 96830497.2 filed on Sep. 30, 1996 in the name of the applicant. Consequently, on the basis of the commands of the control unit 2, the switch matrix 6 is capable of coupling the lines 8 associated with the weights corresponding to the word to be recognized to at least some of the input lines 25 of the memory 10.

The hardware to implement the memory 10 comprises a memory of the associative type or content addressable memory of a type well known in the art. When it receives a datum formed by a sequence of elements at its input, it outputs a datum correlated to the address of the line (generally row) in which the datum which is closest to the input datum is stored. Preferably, the memory 10 is of the auto-associative type, i.e., it directly outputs the stored word closest to the input word. For example, the hardware to perform the memory function for the memory 10 may be of any acceptable type of the many known in the prior art, such as that described in the article by A. Kramer, M. Sabatini, R. Canegallo, M. Chinosi, P. L. Rolandi and P. Zabberoni entitled "Flash-Based Programmable Nonlinear Capacitor for Switched-Capacitor Implementations of Neural Networks" in *IEDM Tech. Dig.*, pp. 17.6.1–17.6.4, December 1994. In particular, this memory is capable of automatically outputting a voltage value proportional to the Manhattan distance between the input datum and the datum stored in each row, as explained below.

Figure 2:
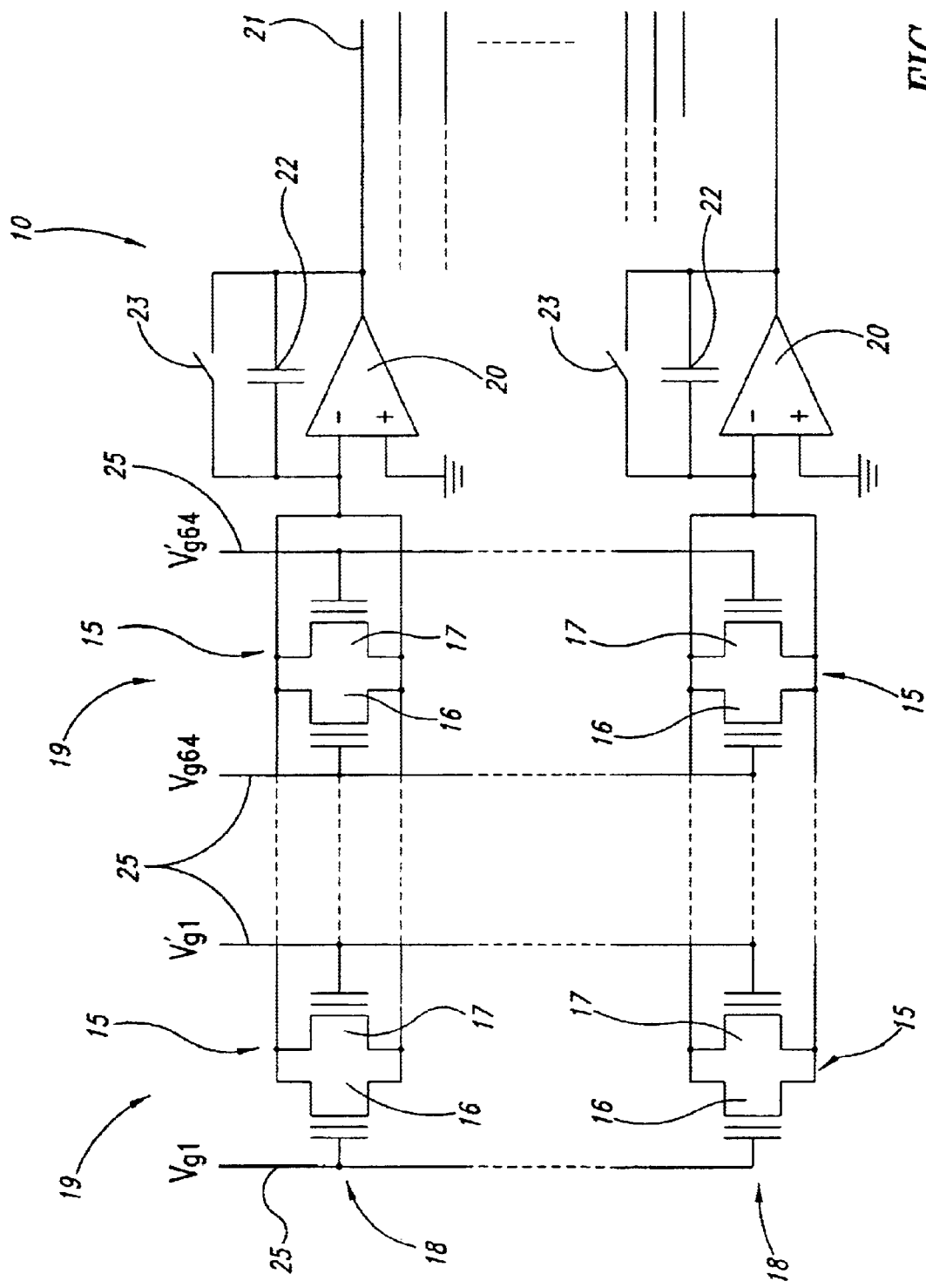
FIG. 2 shows the structure of the associative memory of FIG. 1.

In detail, as shown for clarity in FIG. 2, is one example of the hardware for the memory array 10 which comprises M×N pairs of cells 15 (4000×64 pairs of cells for example), located in M rows 18 and N columns 19. Each pair of cells 15 defines a memory location and comprises a first cell 16 and a second cell 17. The drain and source terminals of all the cells 16, 17 disposed on one and the same row are coupled together to the inverting input of an operational amplifier 20 in charge integration configuration, having a non-inverting input coupled to earth and output 21 coupled to the inverting input via a capacitor 22. A reset switch 23 controlled by the control unit 2 (not illustrated) is located in parallel with the capacitor 22. The outputs 21 of the operational amplifiers 20 define the outputs of the memory array 10.

The gate terminals of the first cells 16 belonging to the same column are coupled to the same input line 25 of the memory whilst the gate terminals of the second cells 17 belonging to the same column are coupled to a respective different input 25. With this configuration, as described in detail in the above-mentioned article by Kramer et al., by storing a pre-determined voltage value in each pair of cells 15 and by supplying complementary voltage values Vg and V'g at the inputs 25 of the two cells 16, 17 of a pair 15, a voltage value is obtained at each output 21 of the array 10. This voltage is proportional to the Manhattan distance between the input datum and the datum stored in each row.

The distance values present at the outputs 21 of the memory 10 are supplied to the selection block 11 for identification of the rows having shorter distance; the selection block 21 is of known type and described, for example, in "Winner-take-all-networks of O(n) complexity" by Lazzaro, S. Ryckenbusch, M. A. Mahowald and C. Mead in Tourestzky D. (ed), *Advances in Neural Network Information Processing Systems* 1. San Mateo, Calif.: Morgan Kauffmann Publisher, pp. 703–711 (1988). The addresses of the data at minimum distance (or the datum) are then supplied to the priority code generation block 12 which places them in a priority code, starting from the datum at minimum distance, and then to the memory element 13 (an EEPROM, ROM, RAM or other memory for example) for them to be stored.

Figure 5:
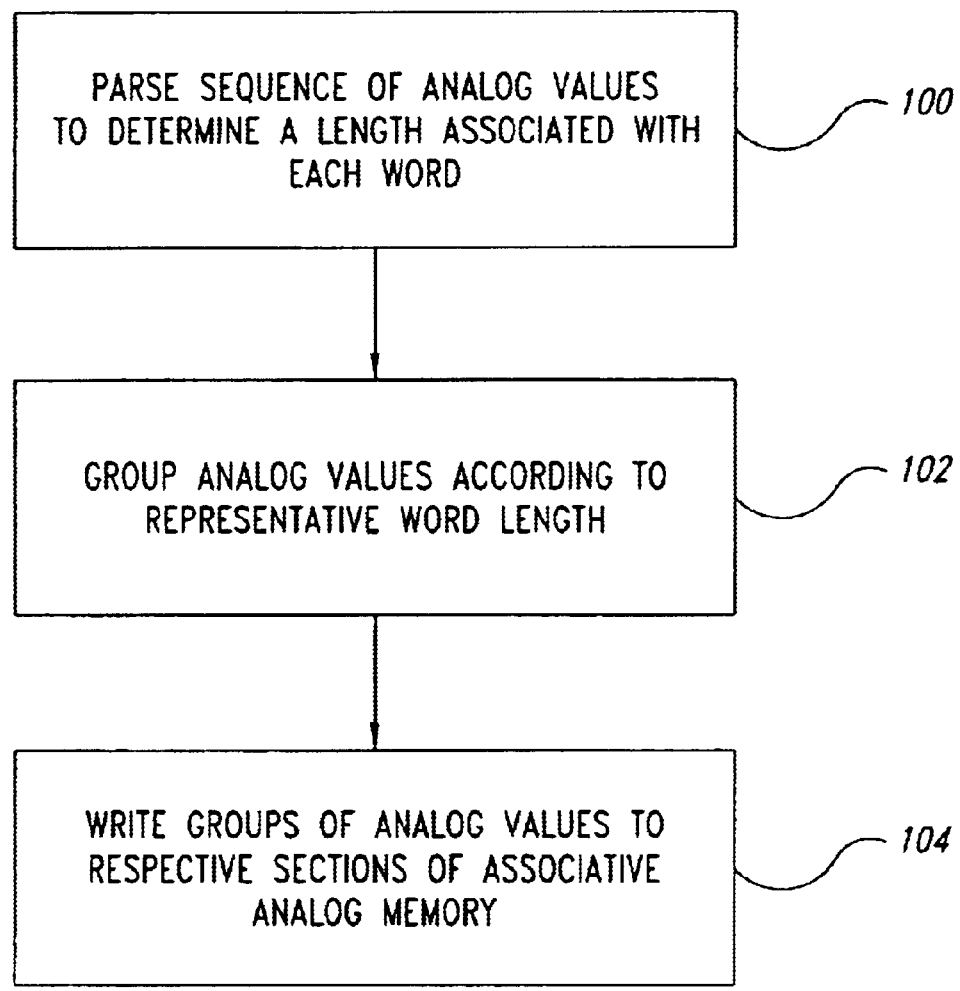
FIG. 5 is a flowchart of a method according to the invention.

In general, a method for optimizing memory occupation in an associative analog memory according to an embodiment of the invention is shown in FIG. 5. The method includes parsing a dataset comprising sequences of analog values representing words to determine a length associated with each word of said dataset (step 100), collecting sequences of analog values representing a word from said dataset having comparable lengths into groups, the words of each group having a different length than the words of each of the other groups (step 102), and writing said groups of data to a plurality of sections, respectively, of an associative analog memory (step 104).

The word recognition device 1 of FIG. 1 operates as follows. Initially a dictionary I is selected, or a base of meaningful words in a certain language. A coding of the dictionary is then defined in such a way as to show the characteristics of the language in a readily computable way. As indicated, the coding takes place by associating an appropriate voltage value (weight) to each character of the alphabet. The dictionary is then inserted into the memory 10 using the coding stored in the table 27, storing several words in each row of the memory, as described below.

Subsequently, the sequence of characters belonging to a word to be recognized is input into the memory 10, using the same coding of the characters used to store the dictionary. Specifically, on the basis of the coding table 27 stored in the data memory 4, the control unit 2 provides commands to the switch matrix 6 so that the matrix 6 supplies the corresponding pairs of voltage values which are complementary to each other and generated by the reference voltage generator 7 to the input lines 25 of the associative memory 10.

The memory 10 then calculates the distance between the word to be recognized and each of the words stored in the memory 10 or in the desired portion thereof, i.e., calculates the sum of the distance between the weights corresponding to the characters forming the word to be recognized and the weights corresponding to the characters forming the words stored by it in the addressed portions of rows. In particular, if we call the coding of a single element (character) of a stored word as and the coding of a corresponding element (character) of the word to be recognized $b_i$, the memory 10 calculates the distance dist defined as:

$$\text{dist} = \sum_{j=1}^{L} \theta(a_i, b_i)$$

in which L is the length of the word to be recognized and θ represents the generic distance calculation function.

On the basis of this distance, as described above, the blocks 11–13 are capable of showing and storing the addresses of the rows of the associative memory 10 relating to the words which are closest to the input word or directly storing the words.

To optimize occupation of the associative memory 10 in view of the presence of words of variable length, according to the invention it is proposed to organize the memory by dividing it into sub-groups (groups of columns or of rows) which are selectively addressable by the control unit 2 through the switch matrix 6, and then to carry out a dedicated search which considers only the words linked to the input configuration, or having homologous dimensions.

In detail,
- given the memory 10 of dimension M×N, in which it may be possible to exclude from the computation a number n of non-consecutive lines (columns);
- given the base I (dictionary) of storable configurations (words) of different length (but≦N), also comprising different types of data;
- the base I is divided into a number S of classes, each containing configurations having the same maximum length;
- indicating by max(j) the maximum length of the configurations contained in the class j, plus an arbitrary number of additional elements (such as the frequency of the configuration—word-expressed as a codified number), whenever the following inequality is met:

$max(1)+max(2)+ \ldots +max(j-1)+max(j) \leq N$ for $j \leq S$ and $t \leq S$. This configuration excludes at most a limited number of elements of the base I,
- the memory is organized in such a way that each line of memory comprises a plurality (j) of groups of memory locations, each group of locations of a line being intended for the storage of a configuration (word), wherein adjacent groups of memory locations of one and the same line (e.g., row) store different configurations (words) of different maximum length, whilst groups of memory locations belonging to different lines but adjacent to the memory lines (e.g., columns) store configurations (words) belonging to one and the same class (having the same length).

An example of organization of the memory 10 in the case in which the configurations (words) are stored in rows is shown in the table of FIG. 3, in which the columns of the memory 10 are re-grouped into groups of columns each associated with a different class of the base I (and the number of columns of each group is equal to the maximum length of the configurations belonging to the respective class) and the configurations (words) belonging to one and the same class are stored in different rows of the respective group of columns.

Given this organization, for the word recognition device 1 of FIG. 1, by considering a dictionary I of approx. 25,000 words of different length, taking into account that the frequency of the words in a text decreases as the length of the words increases and that words of length greater than 24 characters represent 0.4% of the total, it is possible to sub-divide the memory 10 in the manner illustrated in detail in the table of FIG. 4, which represents the content of the table 26 stored in the data memory 4.

The organization described above enables 90% occupation of the memory to be obtained with only 0.4% of words not stored.

With this type of organization, word recognition takes place by comparing the word supplied to the inputs 25 of the memory 10 with the words stored in the corresponding group of columns.

The organization described above enables, among other things, different types of data to be loaded onto the same row, associating them with the classes organized by columns and then selecting the columns necessary for the calculation on the basis of the data required. For example, as an alternative to that shown in the table of FIG. 4, in which the memory stores only completed words, it is possible to store in the same memory in part the weights used for the recognition of the individual characters and in part the weights used for the recognition of the words, thus using a single memory both for recognition of characters (OCR) and for recognition of words.

The advantages that can be obtained with the memory organization described are as follows. The optimization of the occupation that can be obtained enables the size of the memory to be reduced for a given application, with the stored configurations being the same, or the number of storable configurations to be increased. It may be used for the storage of data of different type, by assigning, for example, a first type of datum to be processed to a sub-group of columns and a second, different, type of datum to another sub-group, permitting a flexible use of the memory. Furthermore, the data remain easily accessible without introducing circuit or logic complexities in the overall memory device for the extraction of the data or their computation.

Finally it will be clear that numerous modifications and variants, all of which come within the scope of the inventive concept, may be introduced to the memory described and illustrated here. In particular, it is emphasized that the application in a word recognition device, as described, is purely by way of illustration. The memory 10 may be either of the auto-associative type (the type of datum output is equal to the type of datum input) or of the hetero-associative type (the type of datum output is different from that input, for example only the address of the line satisfying a given computation is output).

What is claimed is:

1. A computer-implemented method for optimizing memory occupation in an associative memory, the method comprising:
    parsing a dataset comprising sequences of analog values representing words to determine a length associated with each word of said dataset;
    collecting sequences of analog values representing a word from said dataset having comparable lengths into groups, the words of each group having a different length than the words of each of the other groups; and
    writing said groups of data to a plurality of sections, respectively, of an associative analog memory wherein the writing includes:
        writing the groups of data in memory locations along lines of the memory extending along a first direction, wherein memory locations adjacent in the first direction and belonging to the same line store data belonging to different groups; and
    writing the data of the same group in memory locations adjacent in a second direction and belonging to different lines.

2. A method as claimed in claim 1 wherein said step of parsing a dataset includes steps of:
    parsing a first dataset into a first ensemble representing weights used for recognizing characters; and
    parsing a second dataset into a second ensemble representing weights used for recognizing words.

3. A method as claimed in claim 2 wherein said step of writing said groups of data includes steps of:

writing data comprising said first ensemble to a first area of said associative analog memory; and writing data comprising said second ensemble to a second area of said associative analog memory, wherein said first and second areas are mutually exclusive.

4. The method of claim 1 wherein the lines comprise rows of memory and the data belonging to the same group are stored in a same set of columns.

5. The method of claim 4, further comprising:

generating a plurality of reference voltages on a plurality of reference lines;

comparing an input datum to data stored in the associative memory;

determining which of the rows of memory should be connected to the reference lines based on the comparing step; and selectively enabling the memory cells that are adjacent in the second direction based on the determining step.

6. The method of claim 1, further comprising storing a correspondence between the groups of data and the addresses of the memory locations in which the groups are stored.

7. The method of claim 1 wherein the associative memory comprises a flash memory for storing analog signals.

8. The method of claim 1, further comprising:

storing, in a first group of sections of the memory, data comprising analog weights used for recognition of words; and storing, in a second group of sections of the memory, data comprising analog weights used for recognition of characters, wherein the first and second sections are mutually exclusive.

9. The method of claim 1 wherein the writing includes writing the groups of data into a plurality of columns of the memory, respectively, such that each column stores data from only a single group.

10. A computer-implemented method for optimizing memory occupation in an associative memory having a plurality of memory locations aligned along first and second directions, the method comprising:

storing data in groups of memory locations along lines of the memory extending along the first direction, each group of memory locations of a line storing a respective datum, wherein groups of memory locations adjacent in the first direction and belonging to one and the same line store data belonging to different classes; and storing store data of a same class in groups of memory locations adjacent in said second direction and belonging to different lines.

11. The method of claim 10 wherein each of the classes comprises data having a same maximum length and adjacent groups of locations of each of the lines store data having different maximum lengths.

12. The method of claim 10 wherein the data comprise sequences of values codifying characters forming words of a dictionary.

13. The method of claim 10 wherein the lines comprise rows of memory and the data belonging to the same class are stored in a same group of columns.

14. The method of claim 13, further comprising:

generating a plurality of reference voltages on a plurality of reference lines;

comparing an input datum to data stored in the associative memory;

determining which of the rows of memory should be connected to the reference lines based on the comparing step; and selectively enabling the groups of memory cells that are adjacent in the second direction based on the determining step.

15. The method of claim 10, further comprising storing a correspondence between the classes of data and the addresses of the groups of memory locations.

16. The method of claim 10 wherein the associative memory comprises a flash memory for storing analog signals.

17. The method of claim 10, further comprising:

storing, in a first group of sections of the memory, data comprising analog weights used for recognition of words; and storing, in a second group of sections of the memory, data comprising analog weights used for recognition of characters, wherein the first and second sections are mutually exclusive.

* * * * *